United States Patent
Yang et al.

(10) Patent No.: US 7,525,139 B2
(45) Date of Patent: Apr. 28, 2009

(54) IMAGE SENSOR WITH A PROTECTION LAYER

(75) Inventors: Wen-Kun Yang, Hsin-Chu (TW); Chin-Chen Yang, Taipei (TW); Wen-Ping Yang, Hsinchu (TW); Wen-Bin Sun, Taipei (TW); Chao-nan Chou, Taipei (TW); His-Ying Yuan, Taoyuan (TW); Jui-Hsien Chang, Jhudong Township, Hsinchu County (TW)

(73) Assignee: Advanced Chip Engineering Technology Inc., Hsinchu County (TW)

( * ) Notice: Subject to any disclaimer, the term of this patent is extended or adjusted under 35 U.S.C. 154(b) by 648 days.

(21) Appl. No.: 11/025,746

(22) Filed: Dec. 29, 2004

(65) Prior Publication Data

US 2005/0242409 A1    Nov. 3, 2005

Related U.S. Application Data

(63) Continuation-in-part of application No. 10/833,345, filed on Apr. 28, 2004, now Pat. No. 7,061,106.

(51) Int. Cl.
*H01L 31/062* (2006.01)
(52) U.S. Cl. .................................. 257/294; 257/428
(58) Field of Classification Search ................. 257/428, 257/294
See application file for complete search history.

(56) References Cited

U.S. PATENT DOCUMENTS

| 4,055,761 A | 10/1977 | Shimomura ................. 250/239 |
| 6,171,883 B1 * | 1/2001 | Fan et al. ..................... 438/65 |
| 6,414,299 B1 | 7/2002 | Churei .................... 250/214.1 |
| 6,483,030 B1 | 11/2002 | Glenn et al. ............... 174/52.4 |
| 6,808,960 B2 * | 10/2004 | Yamamoto .................. 438/107 |
| 2003/0057359 A1 | 3/2003 | Webster ...................... 205/216 |
| 2005/0184219 A1 | 8/2005 | Kirby ....................... 250/208.1 |
| 2005/0236684 A1 | 10/2005 | Chen et al. .................. 257/433 |

* cited by examiner

*Primary Examiner*—Douglas M Menz
(74) *Attorney, Agent, or Firm*—Kusner & Jaffe

(57) ABSTRACT

An image sensor die comprises a substrate and an image sensor array formed over the substrate. Micro lens are disposed on the image sensor array. A protection layer is formed on the micro lens to prevent the micro lens from particle containment.

8 Claims, 3 Drawing Sheets

ID(TH A PROTECTION # IMAGE SENSOR WITH A PROTECTION LAYER

RELATED APPLICATIONS

The present invention is a continuation-in-part (CIP) application of application Ser. No. 10/833,345, filed by the identical assignee of the present application, entitled "Structure of image sensor module and a method for manufacturing of wafer level package" filed on Apr. 28, 2004 now U.S. Pat. No. 7,061,106. The application is incorporated herein by reference.

BACKGROUND OF THE INVENTION

1. Field of the Invention

This invention relates to an image sensor, and more particularly to an image sensor structure free of particle contamination on micro lens, and the method for manufacturing the same.

2. Description of the Prior Art

The semiconductor technologies are developing very fast, and especially semiconductor dice have a tendency toward miniaturization. However, the requirements for the functions of the semiconductor dice have an opposite tendency to variety. Namely, the semiconductor dice must have more I/O pads into a smaller area, so the density of the pins is raised quickly. It causes the packaging for the semiconductor dice to become more difficult and decrease the yield. The main purpose of the package structure is to protect the dice from outside damages. Furthermore, the heat generated by the dice must be diffused efficiently through the package structure to ensure the operation the dice. Most of the package technologies divide dice on a wafer into respective dice and then to package and test the die respectively. Another package technology, called "Wafer Level Package (WLP)", can package the dice on a wafer before dividing the dice into respective dice. The WLP technology has some advantages, such as a shorter producing cycle time, lower cost, and no need to under-fill or molding.

A digital image technique has been wildly applied to image shooting instrument such as digital camera, image scanner, etc. The conventional CMOS sensor is disposed on a circuit board. The CMOS sensor has a chip secured therein. The lens seat has a focusing lens for focusing the image onto the chip of the CMOS sensor. Through the lens, the image signal is sent by the chip to a digital processor for converting the analog signal into digital signal. The Chip of the CMOS sensor is relatively sensitive to infrared ray and dust particles. If the unwanted particles are not removed from the sensor, it leads to downgrade the quality of the device. In order to achieve the purpose, the removal by manual may damage the sensitive chip. Typically, the image sensor module is formed by using a method of COB or LCC. One drawback of the COB is lower yield rate during packaging process due to particle contamination on sensing area. Besides, the drawbacks of the LCC are higher packaging cost and lower yield rate due to particle contamination on sensing area.

Further, micro lenses are optical components on semiconductors utilized as solid state imaging devices. One of the most important considerations in designing and manufacturing micro lenses is photosensitivity. One reason micro lens photosensitivity may be reduced is that the area of each micro lens has been reduced below an optimum value. Moreover, SHELL CASE company also develops wafer level package technique, the image sensor dice packaged by the SHELL CASE is higher cost due to requiring two glass plate and complicate process. And, the transparency is bad due to epoxy wearing out, and the potential reliability may be reduced. U.S. Pat. No. 5,514,888 for ON-CHIP SCREEN TYPE SOLID STATE IMAGE SENSOR AND MANUFACTURING METHOD THEREOF; issued May 7, 1996 to Yoshikazu Sano, et al. teaches a method for forming charge-coupled devices (CCDS) on a silicon substrate. A micro lens array is formed over the CCD array using conventional lithography and re-flow techniques.

Therefore, what is desired is to provide a novel image sensor structure free of particle contamination on sensing area.

SUMMARY OF THE INVENTION

Therefore, the present invention has been made in view of the above problems in the prior arts, and it is an objective of the present invention to provide an image sensor die structure without particle contamination on micro lens and method for manufacturing the same.

An image sensor die comprises a substrate and an image sensor array formed over the substrate. Micro lens are disposed on the image sensor array. A protection layer having character of water repellency and/or oil repellency is formed on the micro lens to prevent the micro lens from particle containment. The protection layer is preferably a low refractive index layer. The protection layer includes PMMA (Polymethylmethacrylat), SOG (Spin on Glass), PolyCarbonate, Fluoropolymer, $SiO_2$, $Al_2O_3$. The image sensor array includes CMOS or CCD. The image sensor die further comprises a filtering layer formed on the protection layer. The image sensor die further comprises a color filter formed over the image sensor array.

DESCRIPTION OF THE PREFERRED EMBODIMENT

Some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims. Then, the components of the different elements are not shown to scale. Some dimensions of the related components are exaggerated and meaningless portions are not drawn to provide a more clear description and comprehension of the present invention.

Figure 1:
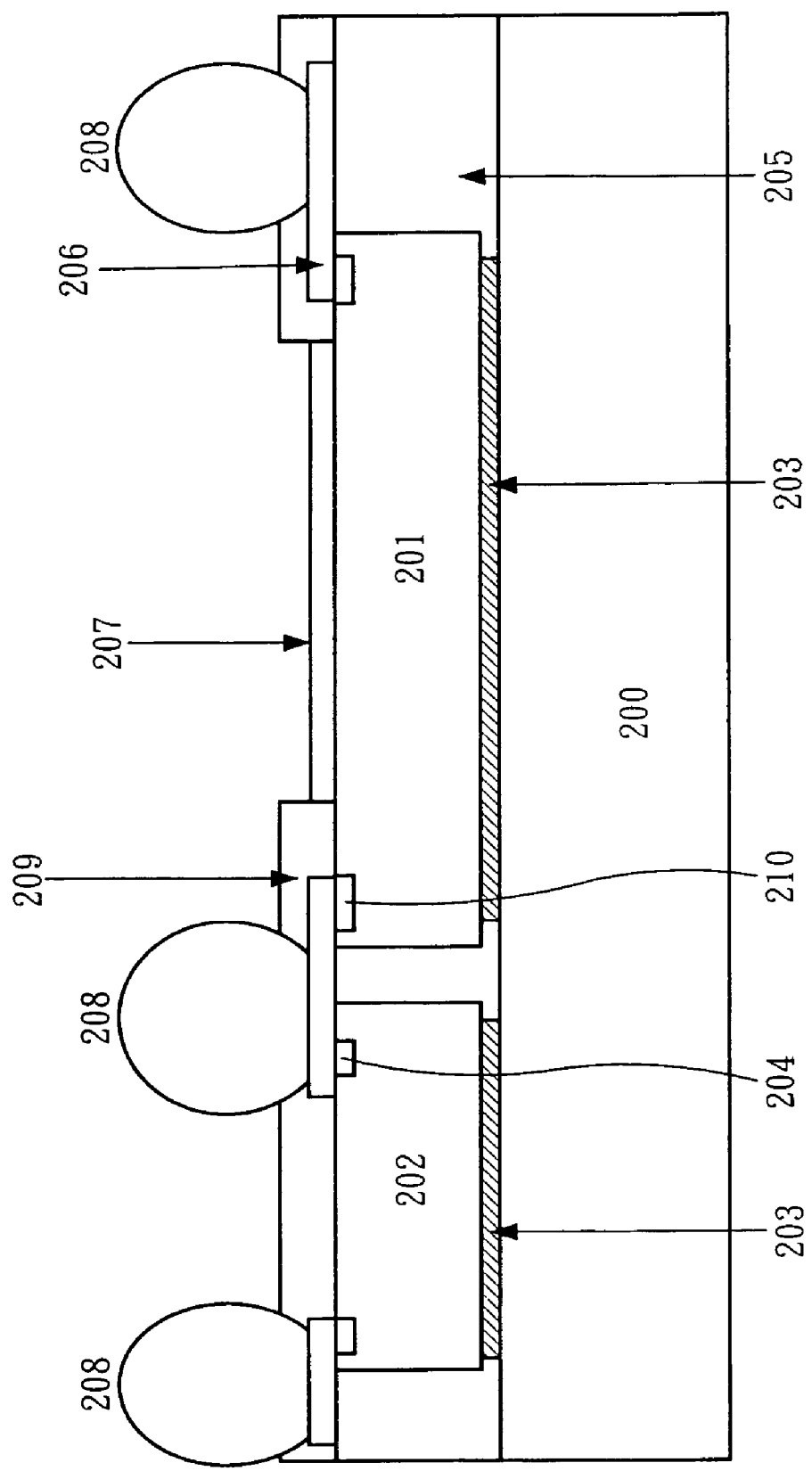
FIG. 1 is a schematic diagram of a package with a side by side structure according to the present invention.

A wafer level package structure is provided, as shown in FIG. 1. The package structure comprises an isolating base 200, image sensor dice 201 and dice 202, a first dielectric layer 205, a second dielectric layer 207, contact conductive layer 206, an isolation layer 209 and solder balls 208. The material of the isolating base 200 can be glass, silicon, ceramic or quartz crystal etc., and even have a round or a rectangular shape. The image sensor dice 201 and the dice 202 are packaged with a side by side structure. The image sensor dice 201 and the dice 202 are adhered to the isolating base 200 by an UV curing type and/or heat curing type adhesion material 203 with good thermal conductivity. The first dielectric layer 205 is formed on the isolating base 200 and filled in a space except the image sensor dice 201 and the dice 202 on the isolating base 200. The material of the first dielectric layer 205 may be silicon rubber.

The second dielectric layer 207 is formed on the image sensor dice 201 to cover a sensing area of the image sensor dice 201. The material of the second dielectric layer 207 is $SiO_2$ to be a protection film. Besides, a filtering film may be formed on the second dielectric layer 207, and the filtering film is, for example IR filtering layer, to be a filter.

The contact conductive layer 206 is formed on metal pads 210 of the image sensor dice 201 and metal pads 204 of the dice 202 to cover the metal pads 210,204. Namely, the contact conductive layer 206 may be electrically coupled to the metal pads 210,204, respectively. The material of the contact conductive layer 206 may be selected from Ni, Cu, Au and the combination thereof. The metal pads 210,204 are, for example Al pads. The isolation layer 209 is formed on the contact conductive layer 206, and the isolation layer 209 has openings on the contact conductive layer 206. The material of the isolation layer 209 is selected from epoxy, resin, SINR (Siloxane polymer) or BCB. The metal soldering balls 208 are formed on the openings by welding method so that the metal soldering balls 208 are electrically coupled with the contact conductive layer 206, respectively. The metal soldering balls 208 may be solder balls 208.

The dice 202 may be selected from DSP die, active die, passive die, support die, CPU die or processor die, and the image sensor dice 201 are CMOS image sensor dice. The image sensor dice 201 are packaged with the dice 202 with a side by side structure.

Figure 2:
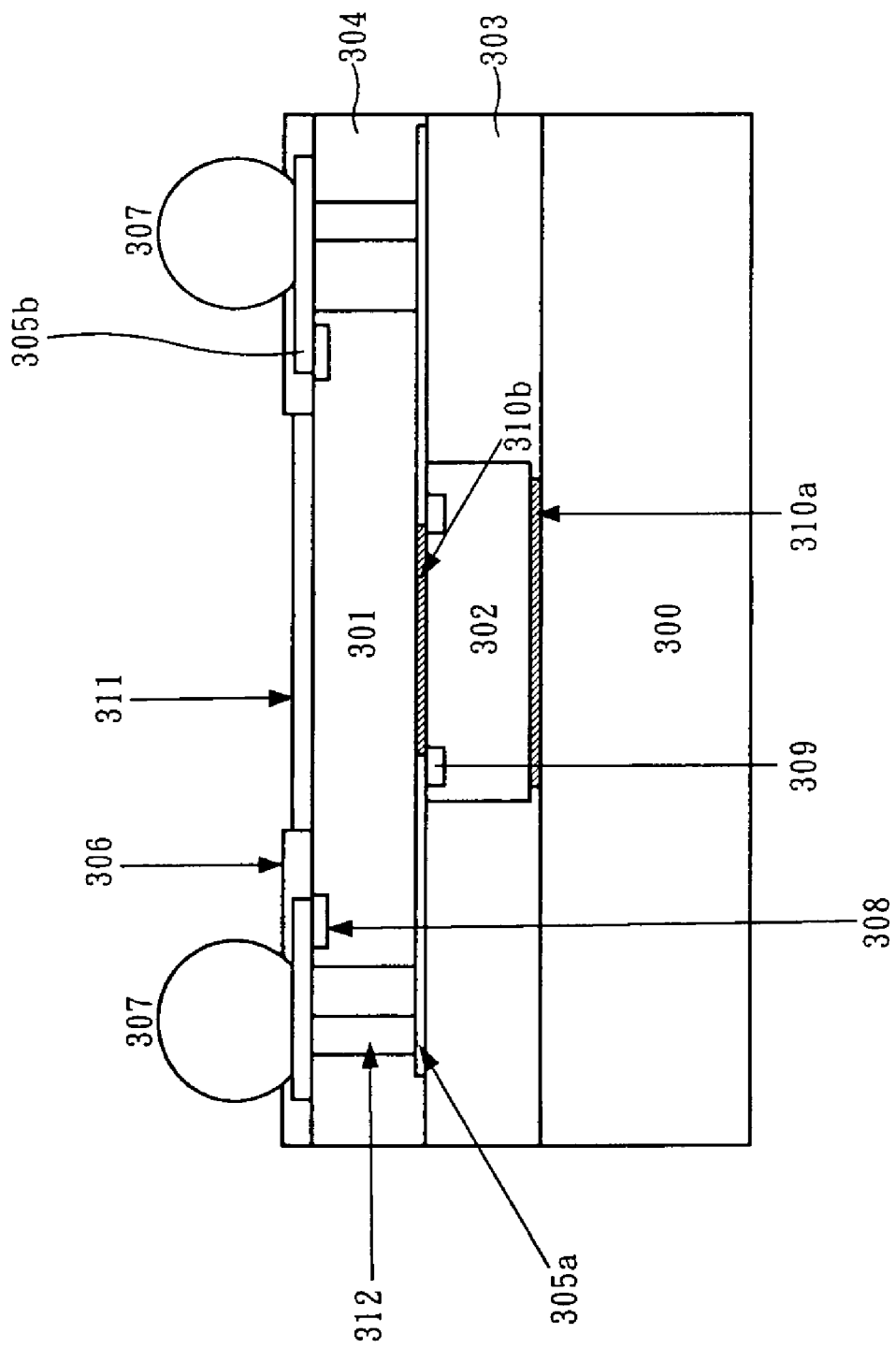
FIG. 2 is a schematic diagram of a package with a stacking structure according to the present invention.

Moreover, another wafer level package structure is provided, as shown in FIG. 2. The dice, in one embodiment, are packaged with a stacking structure. The package structure comprises an isolating base 300, image sensor dice 301 and dice 302, a first dielectric layer 303, a second dielectric layer 304, a third dielectric layer 311, contact conductive layer 305a, 305b, an isolation layer 306 and solder balls 307. The material of the isolating base 300 is glass, silicon, ceramic or quartz crystal etc., and even has a round or a rectangular shape. The image sensor dice 301 and the dice 302 are packaged with a stacking structure. The dice 302 are adhered to the isolating base 300 by an UV curing type and/or heat curing type adhesion material 310a with good thermal conductivity. The first dielectric layer 303 is formed on the isolating base 300 and filled in a space except the dice 302 on the isolating base 300. The material of the first dielectric layer 303 may be silicon rubber.

The contact conductive layer 305a is formed on metal pads 309 of the dice 302 to cover the metal pads 309 to electrically couple to the metal pads 309, respectively. The image sensor dice 301 are adhered to the dice 302 by an UV curing type and/or heat curing type adhesion material 310b with good thermal conductivity. The second dielectric layer 304 is formed on the first dielectric layer 303 and filled in a space except the image sensor dice 301, and the second dielectric layer 304 has via hole 312 formed on the contact conductive layer 305a. The material of the second dielectric layer 304 is $SiO_2$.

Besides, the third dielectric layer 311 is formed on the image sensor dice 301 to cover a sensing area of the image sensor dice 301. However, the third dielectric layer 311 should not affect function of the image sensor dice 301. The material of the third dielectric layer 311 is $SiO_2$ to be a protection film. Specially, a filtering film may be formed on the third dielectric layer 311 on the image sensor dice 301, and the filtering film is, for example IR filtering layer, to be a filter.

The contact conductive layer 305b is formed on metal pads 308 of the image sensor dice 301 and filled in the via hole 312 to cover the metal pads 308. Namely, the contact conductive layer 305b is electrically coupled to the metal pads 308 and the contact conductive layer 305a. The material of the contact conductive layer 305a, 305b may be selected from Ni, Cu, Au and the combination thereof. The metal pads 308, 309 are, for example Al pads. The isolation layer 306 is formed on the contact conductive layer 305b, and the isolation layer 306 has openings on the contact conductive layer 305b. The material of the isolation layer 306 is selected from epoxy, resin and the combination thereof.

The metal soldering balls 307 are formed on the openings by welding method so that the metal soldering balls 307 are electrically coupled with the contact conductive layer 305b, respectively. The metal soldering balls 307 may be solder balls 307.

The dice 302 may be selected from DSP die, active die, passive die, support die, CPU die or processor die, and the image sensor dice 301 are CMOS image sensor dice. The image sensor dice 301 are packaged with the dice 302 with a stacking structure.

Figure 3:
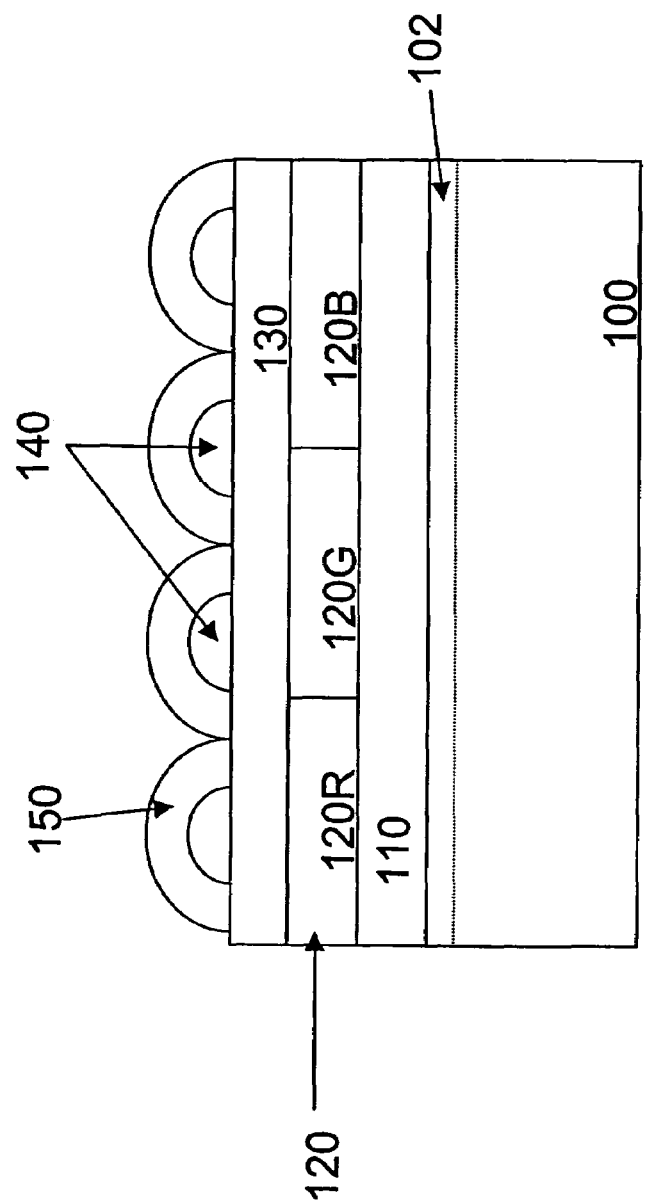
FIG. 3 is a schematic diagram of an image sensor die according to the present invention.

Referring to FIG. 3, micro lens arrays 140 are generally formed on the top surfaces of silicon chips. The substrate 100 bears a plurality of CMOS devices in sensing area 102. The image sensor includes an isolation layer 110 formed over a substrate 100. A color filter layer 120 is next formed over the isolation layer 100 with sub-pixel areas properly aligned with active devices in the substrate 100. Another layer 130 is generally formed over the color filter layer 120. There are several ways well known to those skilled in the art to proceed with the formation of a micro lens array. The layer of lens forming material 140 is applied to the substrate. One material found suitable for this application is a mixture of melamine resin and generic novolac base resin. Individual lens areas are formed in the lens material layer 140 by masked exposure and developing. For example, a photo resist (PR; not shown) is deposited over the lens material layer 140. Conventional lithographic techniques are then utilized to form patterns in the PR by using exposure and development step. PR is then stripped. The devices are hard baked to re-flow the micro lenses 140 into the proper optical form by controlling time and temperature. Individual Red/Green/Blue (RGB) sub-pixel areas 120R, 120G, 120B, respectively, are shown aligned over corresponding CMOS devices in substrate 100 as known in the art.

Figure 4:
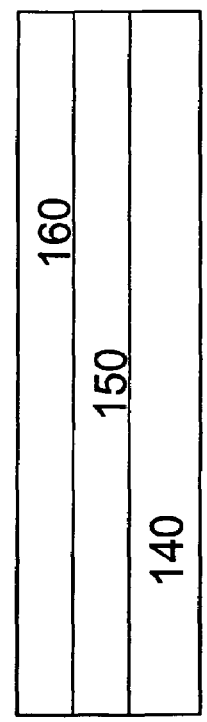
FIG. 4 is a schematic diagram of a protection layer on the micron lens according to the present invention.

The present invention provides an image sensor device as shown in FIG. 3. The material of the substrate 100 can be glass, semiconductor material, ceramic or quartz etc. Moreover, a protection layer 150 can be covered on the micro lenses 140. The material of the protection layer 150 includes $SiO_2$ or $Al_2O_3$ formed by spin coating. Further, the material for the protection layer 150 could be PMMA (Polymethylmethacrylat), SOG (Spin on Glass), PolyCarbonate or Fluoropolymer. The thickness of the protection layer 150 is controlled less than 0.5 micron meters (μm) so that it will not affect the function of the CMOS sensor. Alternatively, the protection layer 150 may comprise a filtering layer 160, for example IR filtering layer, formed on the protection layer 150 to act as a filter, as show in FIG. 4. The protection layer 150 may prevent the micro lens from particle containment. The user may use liquid or air flush to remove the particles on the protection layer 150 without damaging the micron lens. The protection layer is a water repellency and/or oil repellency. Preferably, the protection layer is a low refractive index layer.

An isolation layer (not shown) is formed over the substrate 100 and it has openings to not cover the image sensor area for conveniently sensing the image. The material of the isolation layer is selected from epoxy, resin and the combination thereof.

Although specific embodiments have been illustrated and described, it will be obvious to those skilled in the art that various modifications may be made without departing from what is intended to be limited solely by the appended claims.

What is claimed is:

1. An image sensor die, comprising:
   a substrate;
   an image sensor array formed over said substrate;
   a micro lens disposed on said image sensor array; and
   a repellency layer formed on said micro lens, wherein a thickness of said repellency layer is less than 0.5 micrometers, wherein the material of said repellency layer includes polycarbonate or fluoropolymer.

2. The image sensor die in claim 1, wherein said repellency layer includes SOG (Spin on Glass) process.

3. The image sensor die in claim 1, wherein said image sensor array includes CMOS or CCD.

4. The image sensor die in claim 1, farther comprising a filtering layer formed on said repellency layer.

5. The image sensor die in claim 4, wherein said filtering layer is IR filtering film.

6. The image sensor die in claim 1, further comprising a color filter formed over said image sensor array.

7. The image sensor die in claim 1, wherein material of said substrate includes glass, semiconductor material, ceramic or quartz.

8. The image sensor die in claim 1, wherein said repellency layer is a water repellency layer, an oil repellency layer or a low refractive index layer.

* * * * *